United States Patent [19]

McNally

[11] Patent Number: 4,602,965
[45] Date of Patent: Jul. 29, 1986

[54] METHOD OF MAKING FETS IN GAAS BY DUAL SPECIES IMPLANTATION OF SILICON AND BORON

[75] Inventor: Philip J. McNally, Woodbine, Md.

[73] Assignee: Communications Satellite Corporation, Washington, D.C.

[21] Appl. No.: 589,267

[22] Filed: Mar. 13, 1984

[51] Int. Cl.$^4$ .................... H01L 21/265; H01L 21/20
[52] U.S. Cl. ........................................ 148/1.5; 29/571; 29/576 B; 148/187; 148/DIG. 84; 357/91
[58] Field of Search ............... 148/1.5, 187; 29/576 B, 29/571; 357/91

[56] References Cited

U.S. PATENT DOCUMENTS

| | | | |
|---|---|---|---|
| 4,108,686 | 8/1978 | Jacobus | 148/1.5 |
| 4,149,915 | 4/1979 | Bohg | 148/186 |
| 4,154,626 | 5/1979 | Joy | 148/1.5 |
| 4,185,291 | 1/1980 | Hirao | 357/22 |
| 4,190,850 | 2/1980 | Tihanyi | 357/23 |
| 4,193,182 | 3/1980 | Lee | 29/571 |
| 4,217,149 | 8/1980 | Sawazaki | 148/1.5 |
| 4,350,991 | 9/1982 | Johnson | 357/23 |
| 4,377,030 | 3/1983 | Pettenpaul et al. | 29/576 B |
| 4,391,651 | 7/1983 | Yoder | 148/1.5 |
| 4,469,528 | 9/1984 | Berth et al. | 29/576 B |
| 4,489,480 | 12/1984 | Martin et al. | 29/576 B |
| 4,494,995 | 1/1985 | Alavi et al. | 148/1.5 |
| 4,505,023 | 3/1985 | Tseng et al. | 29/576 B |
| 4,519,127 | 5/1985 | Arai | 29/576 B |

OTHER PUBLICATIONS

Stoneham et al., Jour. Electronic Mat. 9 (1980) 371.
Rao et al. in Ion Implantation in Semiconductors, ed. Chernow et al., Plenum, N.Y., 1977, p. 77.
Martin et al., Jour. Appl. Phys. 53 (1982) 8706.

*Primary Examiner*—Upendra Roy
*Attorney, Agent, or Firm*—Sughrue, Mion, Zinn, Macpeak and Seas

[57] ABSTRACT

A method of preparing an active surface layer on a semi-insulating GaAs substrate comprising the steps of ion implanting a surface layer with silicon to form an n-type active layer and ion implanting a buried diffusion layer beneath the active layer with boron to prevent defects in the substrate from influencing the active region. The method is particularly useful for GaAs MESFETs.

7 Claims, 4 Drawing Figures

METHOD OF MAKING FETS IN GAAS BY DUAL SPECIES IMPLANTATION OF SILICON AND BORON

BACKGROUND OF THE INVENTION

The invention relates generally to GaAs semiconductor devices and it relates, in particular, to a method of making n-type surface regions on GaAs.

Semiconductor devices made of GaAs show much promise for superior performance and the technology for GaAs has been advanced to the point where microwave and digital devices have become commercially available. Ion implantation into GaAs has become the preferred method for doping this material. However, the fabrication of n-type regions in GaAs has always presented difficulties. The conventional method of fabricating ion implanted n-type regions for FET GaAs devices is to implant doping atoms of silicon or selenium into semi-insulating GaAs substrates. The implanted substrate is then annealed at elevated temperature to remove the radiation damage caused by the energetic ions during implantation. This annealing moves the implanted doping atoms into substitution lattice sites to electrically activate the GaAs. Since the implanted doping atoms are embedded in the host substrate, the electrical properties of the implanted region are dependent upon the quality of the substrate in terms of residual impurities, lattice defects and stoichiometry. The disadvantage of this method is the absence of control in producing predictable electrical properties of an n-type implanted layer on semi-insulating GaAs. At the present time, it is required that substrates by pre-selected based on positive results on substrates from a given ingot of GaAs. This procedure is called ingot qualification. Using this procedure, most manufacturers of semi-insulating GaAs substrates measure resistivity and carrier mobility as part of qualifying substrates for direct ion implantation. However, these measurements are subject to error in interpretation and do not necessarily guarantee successful ion implantation results. Furthermore, only a fraction of the GaAs ingots pass the test so that the yield is correspondingly lowered.

An alternative procedure is to epitaxially grow a high resistivity buffer layer on top of a semi-insulating GaAs substrate and then to implant an active region into the buffer layer. This approach reduces the influence of the substrate and thus has the potential for increasing the yield. It relies on the fact that the implanted ions are embedded in higher quality epitaxial GaAs. However, this approach increases the complexity of the substrate fabrication process and produces an additional uncertainty for the quality of the material in which the ion implantation occurs. Because buffer layer epitaxial material is of a lower resistivity than semi-insulating bulk material, potential isolation problems may occur between devices on the same epitaxial layer when planar fabrication is used. In addition, the semi-insulating bulk substrate continues to influence the quality of the epitaxial buffer layer.

It is believed that the fundamental problem with ion implanting bulk GaAs arises during the implant anneal. The ion implantation produces a disordered surface region that is either amorphous or at least consists of regions of amorphous material. In the anneal following the implantation, the disordered region epitaxially recrystallizes on the undisturbed substrate. However, because of the necessarily high temperatures involved, impurities, vacancies and other defects from both the surface layer as well as the substrate tend to be swept toward the surface, the region which will become electrically active. Thus the quality of the GaAs substrate is critical to the electrical properties of the implanted GaAs surface. Furthermore, the high annealing temperatures cause the distribution of implanted dopant atoms to broaden. The low value of the gradient of this distribution appears to be strongly dependent upon the quality of the substrate.

SUMMARY OF THE INVENTION

Accordingly, it is an object of this invention to provide an n-type surface region in GaAs that is not strongly dependent upon the quality of the substrate.

It is a further object of this invention to provide a method for implanting n-type GaAs regions in wich the implant anneal does not bring bulk defects to the surface.

It is yet a further object of this invention to provide a method of implanting n-type GaAs that has a steep and reproducible gradient.

The invention can be summarized as a method of producing surface n-type regions in GaAs by implanting the surface with silicon and implanting beneath the silicon a buried diffusion barrier of boron. After both the silicon and boron have been implanted, the GaAs is annealed to remove the implantation damage and the diffusion barrier of boron isolates the silicon doped region from the substrate.

DETAILED DESCRIPTION OF THE PREFERRED EMBODIMENTS

Figure 1:
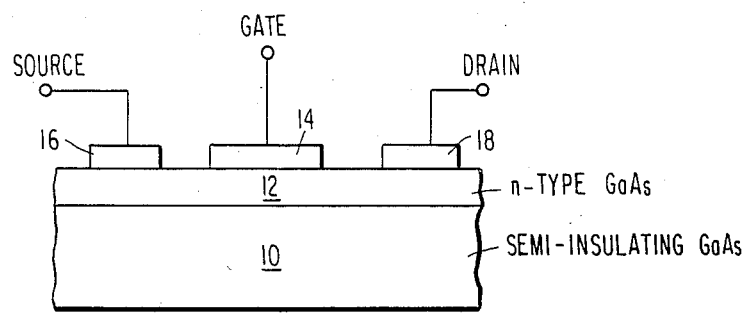
FIG. 1 is a cross-sectional view of a simplified GaAs MESFET.

FIG. 1 illustrates in cross-section a simplified metal-semiconductor field-effect transistor (MESFET) made from GaAs. The device is formed on a substrate 10 of semi-insulating GaAs which, as was described previously, may itself be a surface layer. On top of the substrate 10 is formed a relatively thin surface layer 12 of n-type GaAs, which is the active region of the device. A metallic gate electrode 14 formed over part of the surface layer 12 creates a Schottky barrier at the interface. A source electrode 16 and a drain electrode 18 establish ohmic contact to the GaAs. Voltage applied to the gate electrode 14 can hold the region of the surface layer 12 beneath the gate electrode 14 near full depletion and variations of the gate voltage will cause controlled variations of the resistance between the source and drain contacts 16 and 18. In a low noise amplifier design, the bias voltage is put near full depletion, while in a digital transistor the voltage swing on the gate electrode 14 produces large variations in the source-to-drain resistance.

GaAs MESFETs are typically fabricated with the surface layer 12 being formed by ion implantation.

However, as previously noted, the substrate 10 in conventional GaAs MESFETs has a major effect upon the electrical properties of the surface layer 12.

According to the invention, a wafer of semi-insulating GaAs is cut from an ingot grown undoped by the LEC (liquid encapsulated Czochralski) method. This wafer is used as a substrate. The single crystal GaAs wafers have a resistivity equal to or greater than $10^7$ $\Omega$-cm, and therefore are semi-insulating, and a mobility of 3,700 $cm^2V^{-1}s^{-1}$. The wafer has a polished surface and is etched in a solution, such as $NH_4OH:H_2O_2:H_2O$, to remove surface crystalline damage by dissolving at least 2 $\mu$m of GaAs. The wafer is rinsed thoroughly in deionized water followed by immersion in HCl to remove the native oxide. The wafer is again rinsed thoroughly in deionized water and dried in pure nitrogen gas.

The wafer is then ion implanted with boron atoms $^{11}B^+$ at 270 keV to a dose of $7 \times 10^{12}$ ions/$cm^2$. This ion implantation produces a boron profile illustrated by curve 20 in FIG. 2 according to the Lindhard-Scharff-Schiott (LSS) theory. Silicon atoms $^{29}Si^+$ are subsequently implanted at 200 keV and $4.225 \times 10^{12}$ ions/$cm^2$ to produce a calculated silicon profile 22 overlying the boron profile 20. The substrate is then capped with approximately 90 nm of $Si_3N_4$ deposited at 400° C. by the plasma enhanced chemical vapor method and furnace annealed at 850° C. for 20 minutes in a forming gas atmosphere to anneal the implantation damage. The $Si_3N_4$ cap is necessary to prevent the decomposition of the GaAs at the elevated temperature implant anneal which electrically activates the silicon to form an n-type GaAs active layer.

The carrier profile 24 is then experimentally determined after completion of wafer fabrication by capacitance versus voltage measurements. It is seen that the peak of the silicon profile 22 is somewhat reduced as measured by the carrier profile 24. The width of the silicon profile 22 or the carrier profile 24 defines the surface layer 12, illustrated in FIG. 1. However, away from its peak, the silicon profile 22 closely agrees with the carrier profile 24, indicating that the boron profile 20 formed below the surface layer 12 acts as a buried diffusion barrier preventing significant interaction between the substrate 10 and the surface layer 12.

In an alternate embodiment of the invention, the order of implantations of the boron and the silicon is reversed and a partial anneal is performed between the implants. The wafer picked for the second embodiment was adjacent in the GaAs ingot to the wafer in the first embodiment. First the wafer is implanted with silicon at 200 keV to a dose of $4.225 \times 10^{12}$ ions/$cm^2$. This produces a silicon profile 26 shown in FIG. 3. Then the wafer is capped with 90 nm of $Si_3N_4$, which operation is performed at 400° C. thus providing partial annealing. Then boron is implanted at 270 keV to a dose of $7 \times 10^{12}$ ions/$cm^2$ to produce the calculated boron profile 28 underlying the silicon profile 26. This boron profile 28 differs from the boron profile 20 of FIG. 2 only in being shifted towards the surface by the energy loss in the $Si_3N_4$ cap. Then the wafer is furnace annealed at 850° C. for 20 minutes to anneal out the implantation damage and to activate the silicon. The resultant carrier profile 30 was experimentally determined by the same capacitance-voltage technique. It is seen that the carrier profile 30 is somewhat lower than the carrier profile 24 of the previous embodiment but is considerably sharper.

From a comparison of the boron profiles 20 and 28 with the carrier concentration profiles 24 and 30, it can be seen that the boron is not itself electrically active, which result is expected from an inspection of the periodic table. Instead it appears that the boron enhances the silicon activation on the Ga sites in the region of low silicon density. It appears that the boron interacts with arsenic vacancies in a way that minimizes the amphoteric nature of silicon doping in GaAs.

Figure 2:
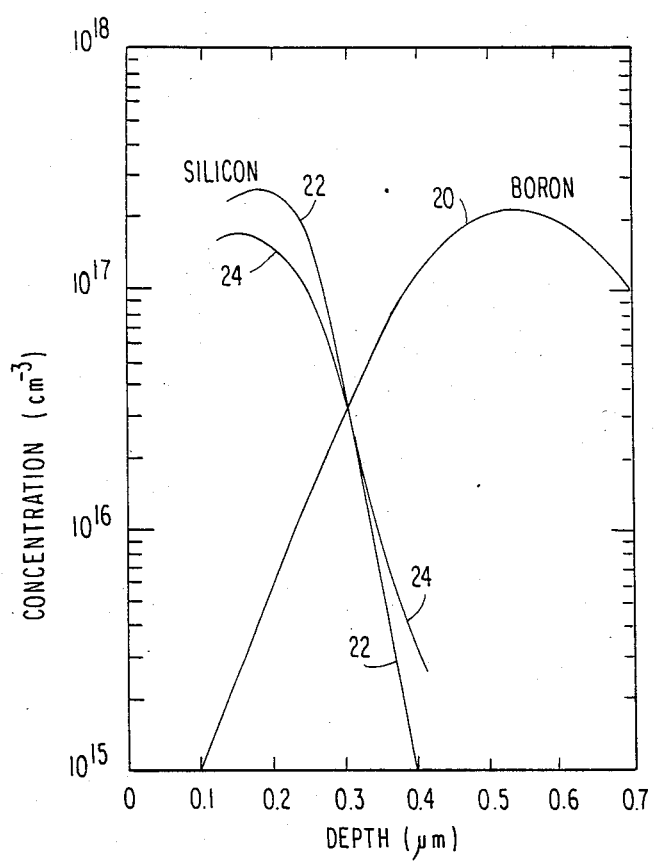
FIG. 2 is a graphical illustration of the doping profiles and carrier concentration for one embodiment of the invention.

The carrier profile 24 for the first embodiment illustrated in FIG. 2 shows good agreement with the theoretical silicon distribution 22 for concentrations below approximately $7 \times 10^{16}$ $cm^{-3}$, where the boron-to-silicon ratio is greater than 0.3. The deviation from theory increases as this ratio becomes larger. As the boron concentration falls off towards the surface, the effect on the silicon profile is reduced. Since the peak boron concentration lies below the implanted silicon, the boron could also be acting as a buried diffusion barrier to out-diffusing arsenic vacancies from the substrate, thus enhancing electrical activation in the tail of the silicon profile 22. The maximum effect from a diffusion barrier should occur at the interface between the silicon and the substrate because the boron concentration increases with depth into the substrate. It should be noted that in material grown in an arsenic-rich condition, low arsenic vacancy concentration contributes to good thermal stability and high-quality ion implanted layers.

Figure 3:
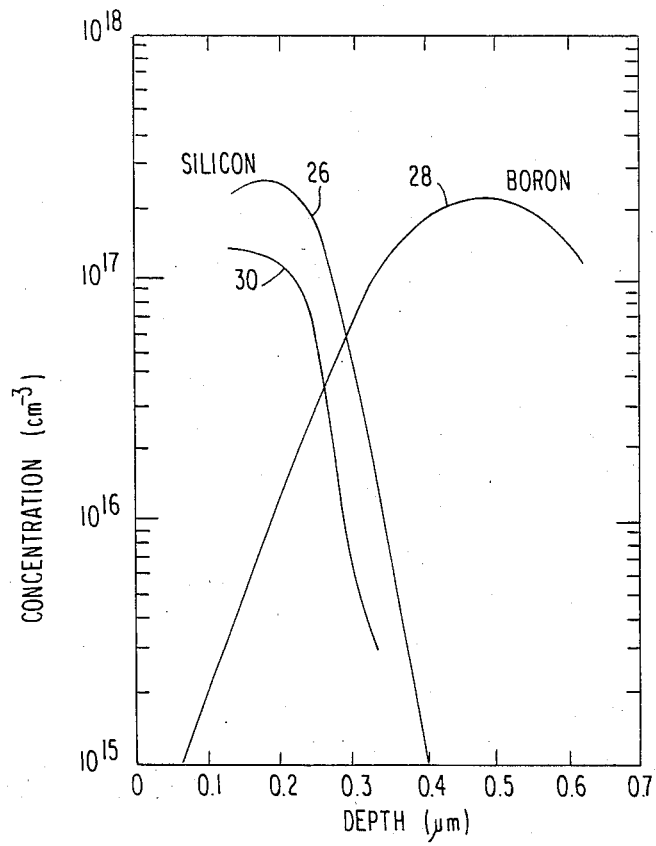
FIG. 3 is a graphical illustration of the doping profiles and carrier concentrations for a second embodiment of the invention.

The carrier profile 30 shown for the second embodiment in FIG. 3 illustrates a different behavior of the implanted boron. In this case, the silicon implanted region undergoes a partial anneal during the $Si_3N_4$ deposition at 400° C. for about 20 minutes. It is believed that similar annealing could be performed between 200° C. and the GaAs decomposition temperature of 500° C. The measured profile 30 is also reduced in thickness by approximately the difference in penetration depth of the two boron distributions 20 and 28. The peak of the carrier distribution 30 is also reduced. Boron in the first embodiment affects the impurity profile in a different way than in the second embodiment. Hysteresis was observed in the capacitance-voltage measurements of the second embodiment at a reverse bias greater than 3 V, corresponding to a carrier concentration of less than $7 \times 10^{16}$ $cm^{-3}$. This observation implies that the boron that was implanted into a partially annealed implanted layer produces traps which reduce free carriers in the tail of the silicon profile 26. However, the boron-induced traps are stable after a subsequent high temperature anneal at 850° C.

The wafers fabricated according to both the first and second embodiments of the invention were used to fabricate GaAs MESFETs with nominal $1 \times 500$ $\mu$m gates and 5 $\mu$m channel lengths. A reference wafer was also prepared from the same GaAs ingot but which did not have any boron implant. The reference wafer was prepared just as were the wafers of the first two embodiments and was implanted with silicon at 200 keV to a dose of $3.74 \times 10^{12}$ $cm^{-2}$ and 75 keV to a dose of $1 \times 10^{12}$ $cm^{-2}$. Because the lower energy silicon implant on the reference wafer implants silicon away from the substrate interface, the extra silicon implant should not affect the phenomena occurring at the interface.

Figure 4:
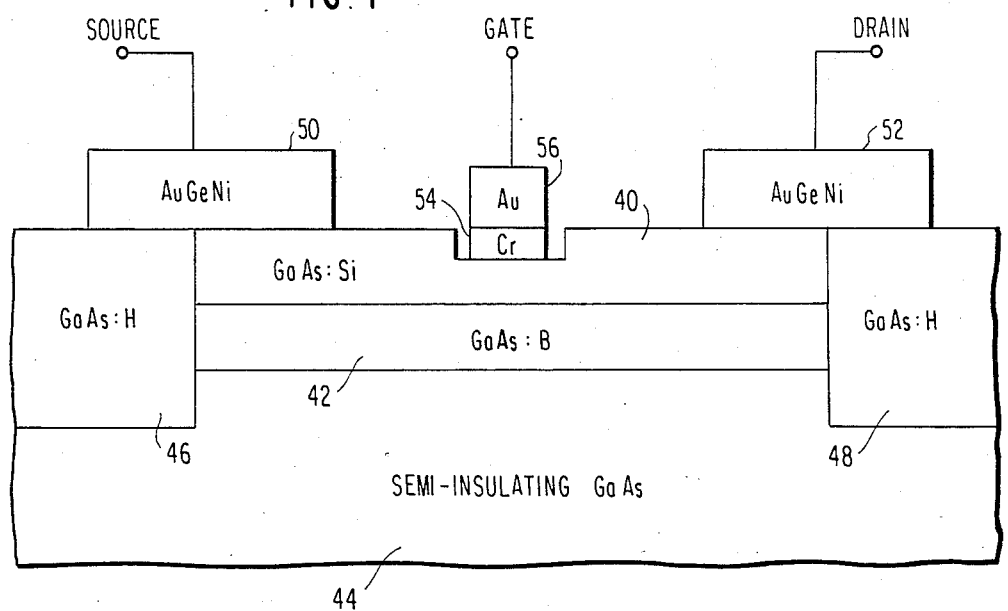
FIG. 4 is a cross-sectional view of a GaAs MESFET built according to this invention.

The MESFETs fabricated on the various wafers all have the cross section illustrated in FIG. 4. A surface layer 40 of silicon-doped GaAs and an underlying barrier layer 42 of boron-containing GaAs (omitted from the reference wafer) are formed on top of a semi-insulating GaAs bulk substrate 44 by the methods previously described. The Si$_3$N$_4$ cap is removed in a hydrofluoric acid solution. Individual transistor active areas are delineated by isolation regions 46 and 48 formed by proton bombardment using photo-resist masking. The isolation regions 46 and 48 surround the channel areas of the individual transistors. If the silicon and boron were selectively implanted only into the indicated regions 40 and 42, no isolation regions 46 and 48 are needed because the semi-insulating substrate 44 would then extend to the surface.

The wafer is then patterned with photo-resist followed by an evaporation of an alloy of AuGeNi to form a source contact 50 and a drain contact 52. These contacts 50 and 52 are alloyed at 500° C. for one minute to form n+source and drain regions in the surface layer 40 directly underlying the contacts 50 and 52.

The wafer is again patterned with photo-resist to define the gate area between the source and drain. The gate area is recessed by etching in a solution, such as NH$_4$OH—H$_2$O$_2$—H$_2$O, to remove a thickness of the GaAs surface layer 40 approximately equal to the depth of the peak carrier concentration of the silicon implant. This etching adjusts the transistor source-drain saturation current and channel pinch-off voltage. The wafer is then thoroughly rinsed in deionized water and dried with high purity nitrogen gas.

Then a 30 nm thick Schottky electrode 54 of chromium is evaporated into the recess followed by a 500 nm thick bonding region 56 of gold.

The MESFETs fabricated by the above method on the various wafers were measured for transconductance and for noise figure (degradation in signal-to-noise ratio upon amplification) and gain at microwave frequencies. These results are presented in Table 1 for the reference wafer, the pre-anneal wafer (second embodiment) and the post-anneal wafer (first embodiment).

TABLE I

| | GaAs MESFET Performance | | |
|---|---|---|---|
| | Reference | Pre-Anneal | Post-Anneal |
| Noise Figure at 4 GHz (dB) | 2.23 | 1.55 | 1.68 |
| Associated Gain at 4 GHz (dB) | 9.7 | 11.1 | 11.3 |
| Noise Figure at 12 GHz (dB) | no measurement | 2.9 | 2.8 |
| Associated Gain at 12 GHz (dB) | no measurement | 6.0 | 7.6 |
| Transconductance at I$_{DSS}$ (mS) | 28 | 42 | 42 |
| Transconductance at Low Noise Bias (mS) | 10 | 24 | 24 |

The microwave measurements were performed at 4 GHz and 12 GHz. For all measurements, the wafers with the buried boron diffusion barrier of this invention showed improved characteristics. The transconductance was measured at both I$_{DSS}$ (the saturation drain-source current at zero gate voltage) and at a low noise bias of 10 mA. In all cases, the wafers with the buried boron diffusion layer of this invention showed improved electrical characteristics over the reference wafer. Much of the above-presented data appeared in an article by the inventor, entitled "Ion implantation of Boron in GaAs devices", appearing in Comsat Technical Review, Volume 13, Number 2, Fall 1983, at pages 437-450.

The invention appears particularly important for operation at the low noise bias point for which the channel is almost completely pinched off to a point of the silicon distribution that is, for example, 10% of the peak value. Thus, the characteristics of the tail of the silicon distribution must be tightly controlled for predictable signal swings about the bias point.

It is believed that a modification of the silicon profile by an implanted boron diffusion barrier will also have application in digital integrated circuits of GaAs, where accurate control of pinch-off voltage is important. The sharp and reproducible gradient provided by this invention, particularly its second embodiment, should allow switching within a fixed voltage increment of 30 to 50 mV.

I claim:

1. A method for preparing GaAs substrates for electronic fabrication, comprising the steps of:
   implanting silicon atoms into an upper layer of a substrate of semi-insulating GaAs; and
   implanting electrically inactive atoms into a buried region substantially underlying said upper layer;
   wherein the concentration of said implanted silicon atoms has a maximum in said upper layer and the concentration of said implanted electrically inactive atoms has a maximum in said buried region and the concentrations of said implanted silicon and electrically inactive atoms are equal at a point between said maxima.

2. A method for preparing GaAs substrates as recited in claim 1, wherein said electrically inactive atoms are boron atoms and further comprising the step of annealing said substrate implanted with silicon and boron.

3. A method for preparing GaAs substrates as recited in claim 1, wherein said silicon implantation occurs subsequently to said boron implantation.

4. A method for preparing GaAs substrates as recited in claim 1, wherein said electrically inactive atom implantation occurs subsequently to said silicon implantation and further comprising a step of annealing said substrate at a temperature between 200° C. and 500° C. between said silicon and electrically inactive atom implanting steps.

5. A method for preparing GaAs substrates as recited in claim 2 wherein:
   said silicon implanting step implants approximately $4.2 \times 10^{12}$ silicon atoms per cm$^2$ with an initial energy of approximately 200 keV; and
   said boron implanting step implants approximately $7 \times 10^{12}$ boron atoms per cm$^2$ with an initial energy of approximately 270 keV.

6. A method for preparing GaAs substrates as recited in claim 2, wherein said boron implantation occurs subsequently to said silicon implantation and further comprising an annealing of said substrate at a temperature between 200° C. and 500° C. between said silicon and boron implantations.

7. A method for preparing GaAs substrates as recited in claim 6, wherein said annealing comprises a deposition of a cap of Si$_3$N$_4$ over said substrate at an elevated temperature.

* * * * *